United States Patent
Ribeiro et al.

(10) Patent No.: US 7,746,053 B2
(45) Date of Patent: Jun. 29, 2010

(54) TESTER FOR RF DEVICES

(75) Inventors: Carlos E. Ribeiro, Tracy, CA (US);
Douglas Falco, Saratoga, CA (US)

(73) Assignee: Micrel, Inc., San Jose, CA (US)

( * ) Notice: Subject to any disclaimer, the term of this patent is extended or adjusted under 35 U.S.C. 154(b) by 148 days.

(21) Appl. No.: 12/198,811

(22) Filed: Aug. 26, 2008

(65) Prior Publication Data

US 2010/0052708 A1    Mar. 4, 2010

(51) Int. Cl.
*G01R 31/28* (2006.01)
(52) U.S. Cl. .......................................... 324/95; 324/754
(58) Field of Classification Search ........................ None
See application file for complete search history.

(56) References Cited

U.S. PATENT DOCUMENTS

| | | | | |
|---|---|---|---|---|
| 4,004,230 A | * | 1/1977 | Campbell | ................ 455/226.3 |
| 4,138,645 A | * | 2/1979 | Parato | ..................... 455/226.1 |
| 4,160,211 A | * | 7/1979 | Wittrock | ................... 455/226.4 |
| 4,776,040 A | * | 10/1988 | Ichikawa et al. | ............. 455/315 |
| 5,656,929 A | * | 8/1997 | Humpherys | ................... 324/95 |

* cited by examiner

*Primary Examiner*—Vinh P Nguyen
(74) *Attorney, Agent, or Firm*—Patent Law Group LLP

(57) ABSTRACT

For testing an RF device, such as an RF receiver/decoder chip that receives an RF signal via an antenna terminal and outputs a digital code at an output terminal, an inexpensive non-RF programmable tester is used. The programmable tester is a commercially available tester that need only generate and receive non-RF digital and analog signals. The RF signals needed for the testing of the RF device are totally supplied by RF generators on a single printed circuit board, external to the commercial tester housing. The board contains controllable RF generating circuitry whose possible output amplitudes and frequencies need be only those necessary for testing the particular DUT. The frequencies may be changed by switching in different crystal resonators mounted on the board.

10 Claims, 2 Drawing Sheets

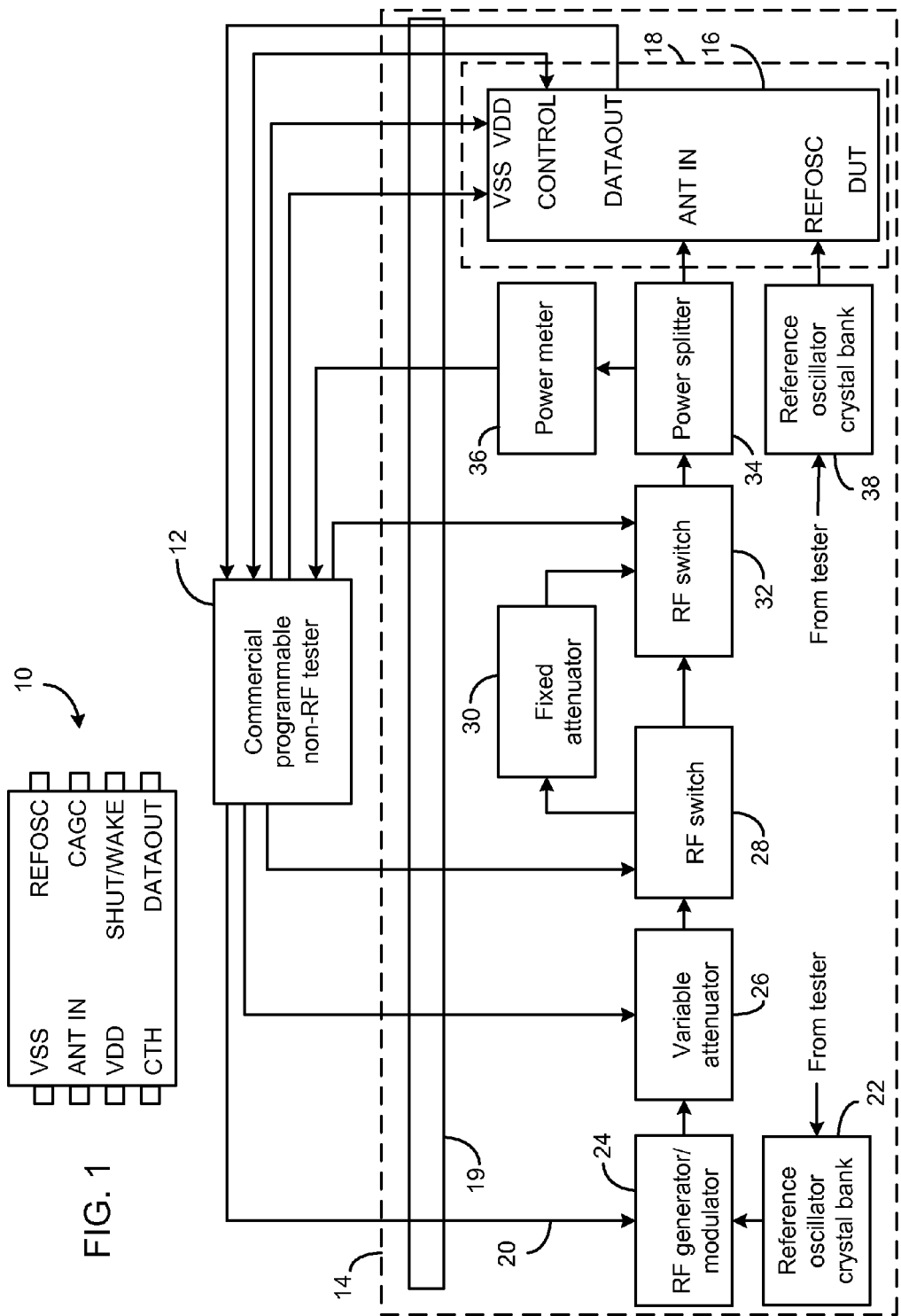

TESTER FOR RF DEVICES

FIELD OF THE INVENTION

This invention relates to a testing structure for rapidly performing a test sequence on a circuit, such as for compliance with its data sheet, where the circuit requires a radio frequency (RF) input signal.

BACKGROUND

Manufacturers of complex integrated circuits test each circuit using automatic test equipment. Commercial programmable testers are used for such testing. Such testers are programmable to carry out any test sequence on a device under test (DUT) and evaluate the resulting signals generated by the DUT. These highly flexible testers include a large number of input and output terminals to accommodate virtually any DUT pin count, and the appropriate tester terminals are temporarily connected to the terminals of the DUT during a test using automated positioning equipment. A test sequence typically lasts for a few seconds or less.

For DUTs that have RF inputs or outputs, such as an RF receiver/decoder chip, the tester must include RF generators and RF detectors and use RF cabling to and from the DUT. Such RF generators are very expensive since they must have a wide frequency range to accommodate a wide variety of DUTs. Programmable testers that include the capability for testing RF devices are typically three to five times more expensive than programmable testers that only test using non-RF digital and analog signals. An RF generator in a tester sometimes adds $30,000-$100,000 to the cost of the tester, and the RF cabling to couple the RF signals to the DUT requires costly connectors and a complex design to minimize noise and attenuation.

A manufacturer of integrated circuits must purchase many programmable testers, since each different circuit being fabricated needs a programmed tester and set up. It is desirable to reduce the cost of testing RF DUTs by reducing the cost of the test system.

SUMMARY OF INVENTION

For testing an RF DUT, such as an RF receiver/decoder chip that receives an RF signal via an antenna terminal and outputs a digital code at an output terminal, an inexpensive non-RF programmable tester is used. The programmable tester is a commercially available tester that need only generate and receive non-RF digital and analog signals. No RF cabling is used for testing the RF DUT.

The commercial non-RF tester is typically contained in one or more equipment enclosures with standard input/output (I/O) leads. The tester may include a programmable computer portion, a signal generating and evaluation portion, and a test head portion (providing an electrical connection interface), where each portion is within its own enclosure having standard electrical I/O terminals. Since the programmable tester does not have RF capability, it is much less expensive than the typical tester for testing an RF DUT. Further, since there is no RF cabling, the test set up is relatively simple since RF noise and RF attenuation from the wires and connections are not a concern.

The RF signals needed for the testing of the RF DUT are totally supplied by RF generators on a single printed circuit board, external to the commercial tester housing. During a test, the terminals of the RF DUT are temporarily connected to terminals on the printed circuit board, such as by using a suitable test contactor mounted on the board. No RF cabling is used for connection to the DUT's RF inputs. The board contains controllable RF generating circuitry whose output frequencies need be only be those necessary for testing the particular DUT. The frequencies may be changed by switching in different crystal resonators mounted on the board for generating several different frequencies, including frequencies at or near the minimum and maximum radio frequencies specified in the DUT's data sheet. The circuit board components may be customized for a particular DUT or a particular family of DUTs, where the required RF testing is limited to only a few discrete frequencies.

The commercial tester has simple non-RF leads connected to input terminals of the board for coupling test control signals from the tester to the board. The board's input terminals are connected by metal traces on the circuit board to control RF oscillators, an RF modulator, RF attenuators, and the DUT, all mounted on the circuit board. Some control signals control and modulate the RF signals generated on the board to produce the necessary operating frequencies specified by the DUT's data sheet, while other control signals control the DUT to perform its various functions under the minimum and maximum operating conditions. The RF signals may be applied to an antenna input of the DUT. The power of the RF input into the DUT may be detected by converting the RF input into a DC voltage corresponding to the RF power level, and the DC voltage is fed back to the tester rather than the RF signal. The output terminals of the DUT are electrically connected to the leads of the tester for monitoring the performance of the DUT.

The DUT is connected to the board via temporary, solderless connections to enable replacement with a new DUT after each test cycle. Suitable test contactors for various package types are commercially available.

Since the RF generators on the circuit board only need to produce a very limited set of frequencies customized for the particular DUT (e.g., to test whether the DUT meets the min/max performance specified in its data sheet), the RF generators are very small and inexpensive, and their frequency can be selected simply by switching in one of a plurality of crystals on the board. Since no RF is being transmitted to or from the board, no RF cabling is required. Thus, an inexpensive non-RF commercial programmable tester can be used for testing RF DUTs, and the programming and set up are simpler.

BRIEF DESCRIPTION OF THE DRAWINGS

FIG. 1 illustrates the pin configuration of a MICRF002/RF022 antenna-in-data-out receiver manufactured by the present assignee, used as a DUT in the example.

FIG. 2 is a block diagram of a test system in accordance with one embodiment of the invention for testing the MICRF002/RF022 and other receivers in the same family.

DETAILED DESCRIPTION

Figure 3:
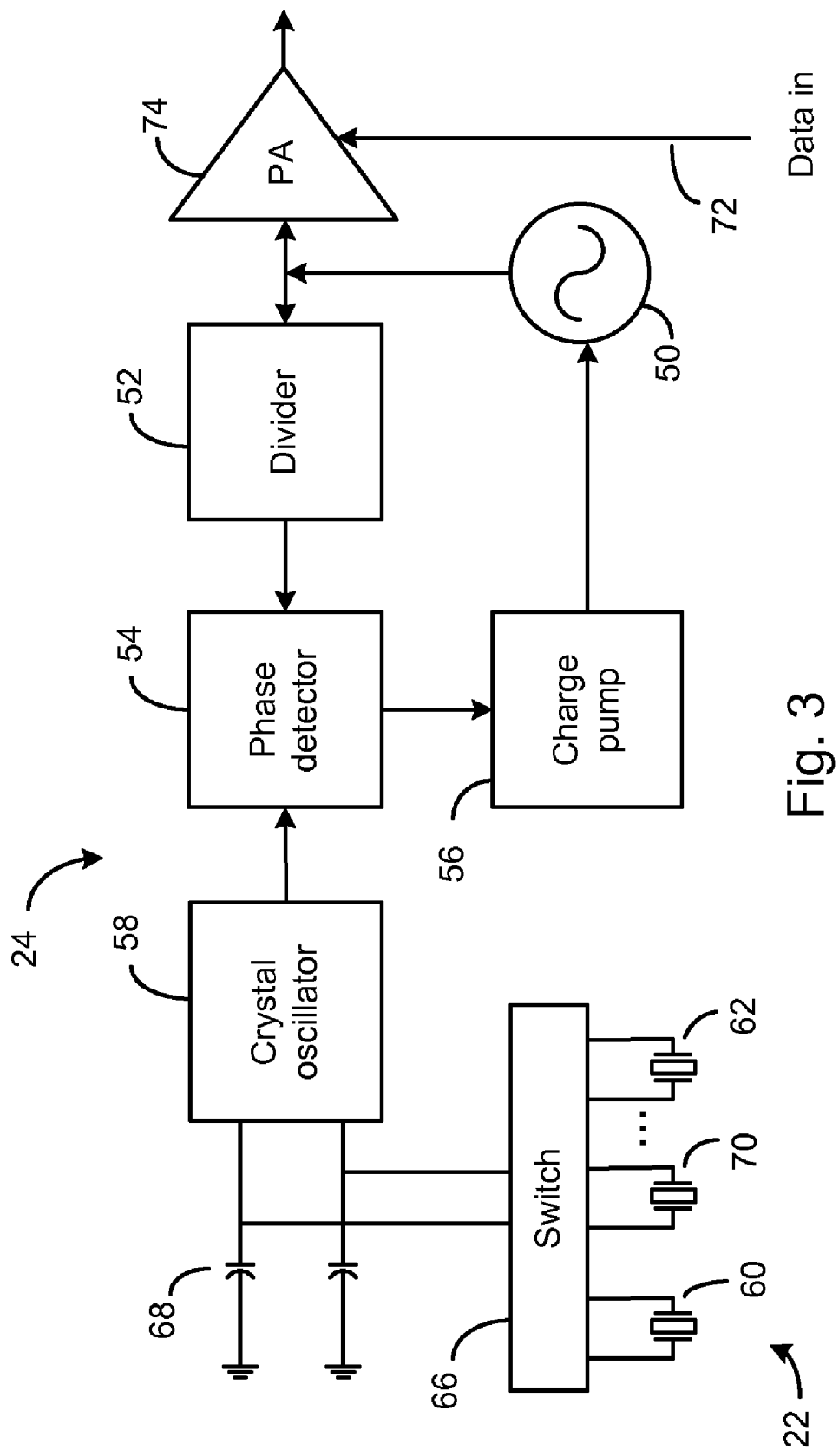
FIG. 3 illustrates the pertinent block diagram of the MICRF112 transmitter along with a crystal bank.

Although the invention can be used to test any RF device, the MICRF002/RF022 will be used as an example of the device under test (DUT). The MICRF002/RF022 is an ASK/OOK (amplitude-shift-keyed/on-off keyed) receiver specified to receive a modulated RF signal between 300-440 MHz at an antenna input and output a digital signal corresponding to the modulating signal. The data sheet for the MICRF002/RF022, available on-line at Micrel.com, is incorporated herein by reference. The MICRF002/RF022 is a superheterodyne receiver that down-converts the incoming RF signal to an intermediate frequency (IF) signal, performs automatic gain control, band-pass filters the IF signal, demodulates the filtered IF signal, then performs threshold detection to determine whether a signal level is a logical 1 or a logical 0. The digital signal is then applied to a data output pin. The MICRF002/RF022 has control pins, set by grounding or not grounding the pins, that set the demodulator filter bandwidth, enable a sweep-mode, and shut down or enable the receiver. The MICRF002/RF022 pulls down a wakeup pin to indicate to an external circuit that an incoming RF signal has been detected.

Each packaged MICRF002/RF022 must be fully tested before being sold to a customer to ensure it properly performs all functions within the minimum and maximum specifications stated in its data sheet.

The MICRF002/RF022 has a 16-pin package that offers the full range of functions and an 8-pin package that offers a limited set of function. FIG. 1 illustrates the functions of the pins of the 8-pin package 10 for simplicity. For the CTH pin (threshold capacitor) and the CAGC pin (automatic gain control), fixed capacitors, whose values are recommended in the data sheet, are connected on the RF circuit board, described later with respect to FIG. 2. Such capacitors and the CTH and CAGC pins are not shown in FIG. 2 for simplicity. The CTH capacitor, in conjunction with an on-chip resistance, creates a time constant for extracting the DC value of the demodulated signal for purposes of logic level data slicing. The CAGC capacitor determines the attack time constant of the AGC.

A test system for the 8-pin version of the MICRF002/RF022 is specifically programmed and configured to connect to the package terminals and rapidly run through a test sequence that performs at least all the functions at the minimum and maximum parameters in the data sheet. Although a commercially available RF programmable tester may be used, such testers are expensive. FIG. 2 illustrates an inexpensive test system that may be used to test each MICRF002/RF022 (or other RF DUT) without the commercial tester requiring RF capability.

A commercially available programmable non-RF tester 12 may be completely housed in a single enclosure or may consist of multiple enclosures housing a programmable computer with a monitor, signal generators and evaluation circuitry, power supplies, and a test head providing an electrical connection interface, where each enclosure has standard electrical I/O terminals. A suitable tester 12 may be the ASL 1000 or ASL 3000 by Credence Systems Corporation, in Milpitas California, whose data sheets are incorporated by reference. Such a tester may be programmed to output any non-RF digital and analog signal on its test leads and evaluate the resulting output signals from the DUT to determine if the results are within an acceptable range programmed into the system.

A printed circuit board 14, outside of the tester 12 housing (s), is positioned with respect to the manufacturing line to receive a DUT 16 (e.g., the MICRF002/RF022) via a robotic arm or other automatic means. The DUT 16 is positioned in a receptacle 18 having contacts that correspond to the pins of the DUT 16. In one embodiment, the receptacle 18 is a suitable test contactor from Johnstech Corporation that is mounted on the board 14 and can receive the 8-pin DUT 16 package. The test contactor enables the DUT 16 to be temporarily electrically connected to the board 14 for a test sequence then quickly removed and replaced with another DUT 16.

The tester 12 has conventional non-RF cabling that attach to one or more multi-pin connectors 19 on the board 14. Various pins of the multi-pin connectors 19 are soldered to metal traces 20 on the board, which lead to the control terminals of various RF components on the board and to various pins of the DUT 16.

In the example of FIG. 2, using a MICRF002/RF022 as the DUT 16, the tester 12 tests all functions of the DUT 16 at a variety of frequencies and amplitudes to ensure compliance with the parameters specified in the data sheet. The tester 12 need only generate digital signals for the test, which are preprogrammed into the tester 12 for the particular DUT 16. Since the MICRF002/RF022 is specified to operate between 300 MHz and 440 MHz, the DUT 16 may first be fully tested at a variety of frequencies near 300 MHz, followed by similar testing near 440 MHz.

The board 14 has a bank of crystals, labeled reference oscillator crystal bank 22, where a digital control signal from the tester 12 switches one of a plurality of crystal resonators to a reference oscillator input of the RF generator/modulator 24. Any suitable switch may be used. The RF generator/modulator 24 is, in one embodiment, a MICRF112 transmitter chip, manufactured by Micrel, Inc., whose data sheet is incorporated herein by reference.

FIG. 3 illustrates the pertinent circuitry in the MICRF112 and the crystal bank 22. The MICRF112 includes a frequency multiplier that multiplies a crystal oscillator reference frequency. The frequency multiplier is a phased locked loop (PLL) that controls a voltage controlled oscillator (VCO) 50. The output of the VCO 50 is divided by 32 by a divider 52, and its output is compared to the phase of the reference frequency by a phase detector 54. The phase detector 54 controls the output voltage of a charge pump 56, which controls the VCO 50 frequency. The output frequency and phase of the VCO 50 is controlled by the PLL so that the divided signal matches the reference signal. A crystal oscillator 58 sets up a resonant frequency with a selected crystal to generate the reference frequency. The crystal oscillator 58 sustains oscillation by taking a voltage signal from the quartz resonator crystal, amplifying it, and feeding it back to the resonator crystal. The rate of expansion and contraction of the quartz is the resonant frequency and is determined by the cut and size of the crystal. When the energy of the generated output frequencies matches the losses in the circuit, an oscillation can be sustained.

One crystal 60 in the crystal bank 22 oscillates at 9.84375 MHz and causes the MICRF112 to output a carrier frequency of 315 MHz. Another crystal 62 in the crystal bank 22 oscillates at 13.560 MHz and causes the MICRF112 to output a carrier frequency of 433.92 MHz. By the tester 12 selectively coupling these two crystals to the crystal input pins of the MICRF112, via the switch 66, the DUT 16 will be operated near its specified minimum and maximum RF input frequencies. The capacitors 68 block DC. Additional crystals (e.g., crystal 70) are used to generate other frequencies, as needed, to test the DUT 16. Any number of crystals may be used.

The MICRF112 has an ASK modulation pin and a FSK (frequency-shift keyed) modulation pin. For testing the MICRF002/RF022, only the ASK modulation is used. The ASK modulation pin on the MICRF112 is labeled the data-in pin 72 in FIG. 3. The tester 12 applies a digital data-in signal to the ASK data-in pin 72, via the board's 14 connectors 19 and metal traces 20. The data-in signal effectively turns a power amplifier 74 on and off for modulating the RF carrier at the amplifier's output terminal (which would normally be connected to an antenna in a non-test application).

In an embodiment where the DUT 16 receives an FM signal (rather than only an AM signal), the tester 12 would apply a modulation signal to the FSK modulation pin of the MICRF112 (or other RF generator on the board 14) to generate an FM signal.

To greatly attenuate the amplitude of the modulated RF signal for application to the antenna input pin of the DUT 16, a variable attenuation circuit is used, comprising a variable attenuator 26 (which provides a variable first range of attenuation), a first RF switch 28, a fixed attenuator 30, and a second RF switch 32. The components of the variable attenuation circuit are controlled by suitable signals from the tester 12. In one embodiment, the variable attenuator 26 is an ADL5330 variable gain amplifier by Analog Devices Inc., whose data sheet is incorporated herein by reference. The ADL5330 can attenuate the RF signal by as much as −48 dB.

The variable attenuator 26 is controlled by the tester 12 (using preprogrammed analog signals) to achieve the maximum specified RF input power for the DUT 16 (−20 dBm). To apply this maximum power RF signal to the DUT 16, the RF switches 28 and 32 are controlled by the tester 12 to bypass the fixed attenuator 30 and apply the signal to the input of the power splitter 34. The RF switch 28/32 may be a model G5Y-1 low signal relay switch by OMRON Electronics, Inc., whose data sheet is incorporated by reference. The control signal for both switches may be the same signal, since the control signal may energize the relays of both switches at the same time. The power splitter 34 is a surface mounted 2-way passive power splitter with a 6dB power loss. No RF cables are used.

One RF split signal is applied to the antenna-in pin of the DUT 16, and the other split RF signal is applied to a conventional power meter 36. The power meter 36 converts the modulated RF signal to an equivalent decibel-scaled value at its DC output. A suitable power meter 36 is a model AD8313 by Analog Devices, In., whose data sheet is incorporated by reference.

The DC output of the power meter 36 is connected to the tester 12 so the tester 12 can determine the antenna-in power to the DUT 16. The variable attenuator 26 is controlled by the tester 12 to achieve a desired power meter level, such as for matching the maximum or minimum data sheet parameters for the DUT 16.

The digital data output of the DUT 16 in response to the modulated RF signal is detected by the tester 12 and compared with the expected results. If the results are correct, the DUT 16 passes the test.

Control signals, typically digital, are also applied to the DUT 16 to control functions of the DUT 16, such as bandwidth filtering, shutdown/enable, a sweep mode, or other functions. A wake signal is also generated by the DUT 16 to signal to an external circuit that an RF signal is being received. Such testing of the wake signal is also performed. The control signals are applied at the appropriate times during the test sequence.

To test the operation of the DUT 16 at a minimum RF power, the RF switches 28 and 32 are controlled by the tester 12 so that the RF signal passes through the fixed attenuator 30, which may attenuate the RF signal down to −95 dBm, which results in the minimum specified RF input power for the DUT 16 after being split by the power splitter 34. The power meter 36 feedback into the tester 12 enables the tester 12 to control the variable attenuator 26 to achieve the minimum specified RF power at the DUT 16 input.

Since the DUT 16 is a superheterodyne receiver, it down converts the incoming RF signal to an intermediate frequency using an internal oscillator (called a local oscillator) whose frequency is determined by a crystal resonator connected to a reference oscillator input of the DUT 16. The reference oscillator determines the DUT's 16 receive frequency. A particular one of a plurality of crystal resonators in a crystal bank 38 is switched by the tester 12 to the reference oscillator pin of the DUT 16 so that the DUT 16 can be tested at its minimum receive frequency of 300 MHz and its maximum receive frequency of 440 MHz. The crystals may have resonant frequencies between 4.6639 MHz and 6.8403 MHz to create a local oscillator frequency needed to receive RF signals between 300 MHz to 440 MHz. The operation of a crystal reference oscillator was described with respect to FIG. 3.

The board 14 may be configured for a family of related products, where the controlling of the components on the board, the DUT test contactor, and the programmed test sequence are particular to a DUT within the family. For example, the board 14 may have all the crystals needed for testing all products in a family even though only a subset of the crystals would be used for a particular product in the family.

In one embodiment, the board 14 measures only about 6 inches by 4 inches.

Although a specific example of the board 14 has been described, the various components, values, and test sequences would be selected for a particular RF DUT.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A test system for devices requiring a radio frequency (RF) input signal, the tester comprising:

a programmable test unit, the programmable test unit outputting non-RF control signals and receiving non-RF test signals from a device under test, the programmable test unit being programmable to control a test sequence for determining a performance of the device under test, the device under test having at least one RF input terminal, the programmable test unit having no RF capability and being enclosed in at least one housing;

a circuit board, external to the at least one housing of the programmable test unit, the circuit board having input terminals connected to the programmable test unit for receiving the non-RF control signals and having output terminals connected to the programmable test unit for transmitting non-RF test signals from the device under test to the programmable test unit, the circuit board comprising:

a first controllable RF oscillator connected to receive a first control signal from the programmable test unit, the first controllable RF oscillator being controllable to output a plurality of radio frequencies where the particular RF output is determined by the first control signal;

an RF modulator coupled to receive an RF output of the first controllable RF oscillator and coupled to receive a modulating signal from the programmable test unit, the RF modulator outputting a modulated RF signal at a first amplitude;

a variable attenuator coupled to an output of the RF modulator and coupled to receive a second control signal from the programmable test unit for outputting a plurality of amplitudes of the modulated RF signal;

a power splitter coupled to receive the plurality of amplitudes of the modulated RF signal, the power splitter having a first output terminal outputting a first split modulated RF signal for coupling to a first RF input terminal of the device under test, the power splitter having a second output terminal outputting a second split modulated RF signal;

a detector having an input terminal coupled to receive the second split modulated RF signal, the detector converting the second split modulated RF signal to a DC level corresponding to a power level of the second split modulated RF signal, the detector having an output terminal coupling the DC level to an input terminal of the programmable test unit; and electrical terminals, configured to be temporarily connected to terminals of the device under test without cabling, to couple the first split modulated RF signal to the first RF input terminal of the device under test, to couple some of the non-RF control signals from the programmable test unit to control input terminals of the device under test, and to couple the non-RF test signals from the device under test to the programmable test unit for evaluation by the programmable test unit of the performance of the device under test in response to the non-RF control signals and the first split modulated RF signal, wherein no RF cabling is used between the programmable test unit and the circuit board.

2. The system of claim 1 wherein the first controllable RF oscillator comprises a plurality of crystal resonators, a crystal oscillator, a frequency multiplier, and a switch controlled by the first control signal to connect one of the crystal resonators to the crystal oscillator to generate one of a plurality of reference frequencies coupled to the frequency multiplier.

3. The system of claim 1 wherein there is no RF cabling from the board to the device under test.

4. The system of claim 1 wherein the modulating signal from the programmable test unit is connected to the RF modulator to switch the RF output of the first controllable RF oscillator on and off.

5. The system of claim 1 wherein the modulating signal from the programmable test unit is connected to the RF modulator to vary a frequency of the RF output of the first controllable RF oscillator to generate an FM signal.

6. The system of claim 1 wherein the variable attenuator comprises:

a first attenuator having an input coupled to receive the modulated RF output of the RF modulator, the first attenuator being coupled to receive the second control signal and having an output for providing an attenuated modulated RF signal based on a magnitude of the second control signal;

a first RF switch having an input terminal coupled to the output of the first attenuator, the first RF switch having a first output terminal and a second output terminal, wherein a third control signal from the programmable test unit controls the first RF switch to selectively couple its input terminal to the first output terminal or the second output terminal;

a fixed attenuator having an input terminal coupled to the first output terminal of the first RF switch, the fixed attenuator having an output terminal; and a second RF switch having a first input terminal connected to the second output terminal of the first RF switch and having a second input terminal connected to the output terminal of the fixed attenuator, wherein a fourth control signal from the programmable test unit controls the second RF switch to selectively couple its output terminal to its first input terminal or its second input terminal.

7. The system of claim 6 wherein the third control signal and the fourth control signal are the same signals.

8. The system of claim 1 wherein the electrical terminals for connection to terminals of the device under test comprise a test contactor.

9. The system of claim 1 wherein the device under test is an RF receiver.

10. The system of claim 1 wherein some of the electrical terminals on the board are electrically connected to the programmable test unit for supplying control signals to the device under test to carry out functions performed by the device under test under different RF parameters.

* * * * *